(12) United States Patent
Oie et al.

(10) Patent No.: US 10,035,978 B2
(45) Date of Patent: Jul. 31, 2018

(54) SEMICONDUCTOR ELEMENT CLEANING LIQUID AND CLEANING METHOD

(71) Applicant: MITSUBISHI GAS CHEMICAL COMPANY, INC., Tokyo (JP)

(72) Inventors: Toshiyuki Oie, Tokyo (JP); Kenji Shimada, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 4 days.

(21) Appl. No.: 15/124,478

(22) PCT Filed: Apr. 20, 2015

(86) PCT No.: PCT/JP2015/061948
§ 371 (c)(1),
(2) Date: Sep. 8, 2016

(87) PCT Pub. No.: WO2015/166826
PCT Pub. Date: Nov. 5, 2015

(65) Prior Publication Data
US 2017/0015955 A1    Jan. 19, 2017

(30) Foreign Application Priority Data

May 2, 2014    (JP) .................................. 2014-095321

(51) Int. Cl.
*C11D 7/06*    (2006.01)
*C11D 11/00*   (2006.01)
(Continued)

(52) U.S. Cl.
CPC ............ *C11D 11/0047* (2013.01); *B08B 3/08* (2013.01); *C11D 3/3947* (2013.01); *C11D 7/06* (2013.01);
(Continued)

(58) Field of Classification Search
CPC .................................................. C11D 11/0047
USPC .......................................................... 510/175
See application file for complete search history.

(56) References Cited

U.S. PATENT DOCUMENTS

| 5,316,573 | A  | 5/1994 | Brusic et al. |
| 8,206,509 | B2 | 6/2012 | Eto et al. |
| 9,063,431 | B2 | 6/2015 | Barnes et al. |

(Continued)

FOREIGN PATENT DOCUMENTS

| JP | 06-81177    | 3/1994 |
| JP | 2009-075285 | 4/2009 |

(Continued)

OTHER PUBLICATIONS

International Search Report issued in Patent Application No. PCT/JP2015/061948, dated May 26, 2015.

*Primary Examiner* — Gregory E Webb
(74) *Attorney, Agent, or Firm* — Greenblum & Bernstein, P.L.C.

(57) ABSTRACT

The present invention makes it possible to provide a semiconductor element cleaning method that is characterized in that: a hard mask pattern is formed on a substrate that has a low relative permittivity film and at least one of a cobalt, a cobalt alloy, or a tungsten plug; and a cleaning liquid that contains 0.001-20% by mass of an alkali metallic compound, 0.1-30% by mass of quaternary ammonium hydroxide, 0.01-60% by mass of a organic water-soluble solvent, 0.0001-0.1% by mass of hydrogen peroxide, and water is subsequently used on a semiconductor element in which, using the hard mask pattern as a mask, the hard mask, the low relative permittivity film, and a barrier insulating film are dry etched, and dry etch residues are removed.

12 Claims, 1 Drawing Sheet

(51) Int. Cl.
  *H01L 21/304* (2006.01)
  *B08B 3/08* (2006.01)
  *C11D 7/32* (2006.01)
  *C11D 7/50* (2006.01)
  *H01L 21/02* (2006.01)
  *H01L 21/3065* (2006.01)
  *H01L 21/308* (2006.01)
  *C11D 3/39* (2006.01)
  *C11D 7/10* (2006.01)
  *C11D 7/12* (2006.01)

(52) U.S. Cl.
  CPC ............... *C11D 7/10* (2013.01); *C11D 7/105* (2013.01); *C11D 7/12* (2013.01); *C11D 7/3209* (2013.01); *C11D 7/5004* (2013.01); *C11D 7/5009* (2013.01); *C11D 7/5013* (2013.01); *C11D 7/5022* (2013.01); *H01L 21/02057* (2013.01); *H01L 21/02063* (2013.01); *H01L 21/02071* (2013.01); *H01L 21/304* (2013.01); *H01L 21/3065* (2013.01); *H01L 21/3085* (2013.01)

(56) References Cited

U.S. PATENT DOCUMENTS

| | | | |
|---|---|---|---|
| 9,422,512 B2* | 8/2016 | Shimada | G03F 7/425 |
| 9,587,208 B2* | 3/2017 | Shimada | H01L 21/02063 |
| 9,803,162 B2* | 10/2017 | Shimada | C11D 3/3947 |
| 2002/0001962 A1 | 1/2002 | Yokoi | |
| 2003/0144163 A1 | 7/2003 | Morinaga et al. | |
| 2007/0135322 A1 | 6/2007 | Morinaga et al. | |
| 2009/0082240 A1 | 3/2009 | Nukui et al. | |
| 2009/0120457 A1 | 5/2009 | Naghshineh et al. | |
| 2011/0014793 A1 | 1/2011 | Muramatsu et al. | |
| 2011/0129998 A1 | 6/2011 | Eto et al. | |
| 2013/0296214 A1 | 11/2013 | Barnes et al. | |
| 2015/0027978 A1 | 1/2015 | Barnes et al. | |
| 2015/0152366 A1* | 6/2015 | Shimada | H01L 21/02063 438/618 |
| 2015/0210966 A1* | 7/2015 | Shimada | C23G 1/20 438/703 |
| 2015/0307818 A1 | 10/2015 | Barnes et al. | |

FOREIGN PATENT DOCUMENTS

| | | |
|---|---|---|
| JP | 2009-231354 | 10/2009 |
| JP | 2011-091248 | 5/2011 |
| JP | 2011-118101 | 6/2011 |
| JP | 2012-182158 | 9/2012 |
| JP | 2013-533631 | 8/2013 |
| TW | 200302272 A | 8/2003 |
| WO | 2013/101907 | 7/2013 |
| WO | 2013/187313 | 12/2013 |

* cited by examiner

[Figure 1]
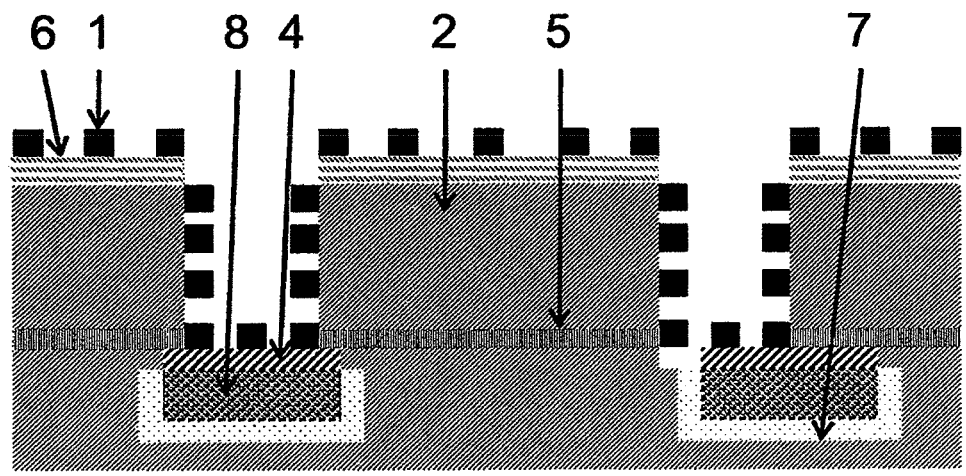
[Figure 2]
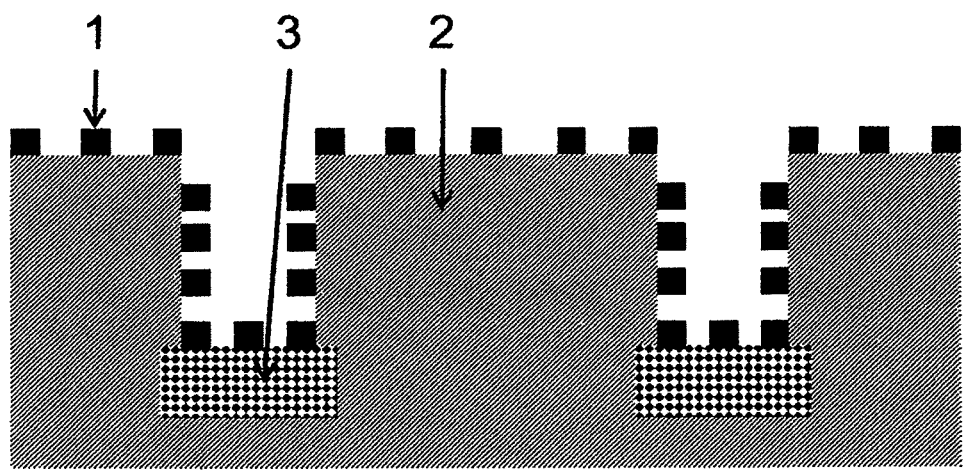

SEMICONDUCTOR ELEMENT CLEANING LIQUID AND CLEANING METHOD

TECHNICAL FIELD

The present invention relates to a cleaning liquid and a cleaning method for removing dry etch residues from a treated surface while suppressing damages on a low-dielectric-constant film, a wiring material such as tungsten, cobalt, a hardmask, a barrier metal and a barrier insulating film during a process for manufacturing a semiconductor integrated circuit.

BACKGROUND ART

Usually, in order to manufacture a highly integrated semiconductor element, a following series of steps are generally performed: a conductive thin film such as a metal film as a conducting wiring material and an interlayer insulating film intended for insulation between the conductive thin films are formed on an element such as a silicon wafer, then a photoresist is uniformly applied onto the surface thereof to provide a photosensitive layer, which is selectively exposed, and developed to produce an desired resist pattern. Next, this resist pattern is used as a mask to perform a dry etching treatment on the interlayer insulating film to form a desired pattern on the thin film. Then, residues resulting from the resist patterning and the dry etching treatment (hereinafter, referred to as "dry etch residues") and the like are completely removed by an ashing method that uses an oxygen plasma or a cleaning method that uses a cleaning liquid.

Recently, along with the progress of miniaturization of the design rules, signal transmission delay is becoming to govern the limit of high-speed processing. Therefore, the conducting wiring material is shifting from aluminum to copper that has lower electric resistance, and the interlayer insulating film is shifting from a silicon oxide film to a low-dielectric-constant film (a film with a dielectric constant smaller than 3; hereinafter, referred to as a "Low-k film"). As miniaturization of wirings progresses, however, increase in the density of current running through the wiring tends to cause electromigration of copper. Accordingly, techniques that use cobalt as a highly reliable wiring material as a replacement of copper have been proposed. In addition, introduction of a cobalt alloy as a cap metal for copper has been reported to suppress electromigration of copper. Moreover, when a resist is applied with a film thickness of 1 µm to a wiring pattern of less than 0.2 µm, the aspect ratio of the wiring pattern (a ratio obtained by dividing the film thickness of the resist by the line width of the resist) becomes too large, which causes problems such as breakdown of the wiring pattern. In order to solve such problems, a hardmask technique is often employed in which a titanium (Ti)- or a silicon (Si)-based film (hereinafter, referred to as a "hardmask") is inserted between a film that is to be actually fabricated with a pattern and a resist film, such that the resist pattern is once transferred onto the hardmask by dry etching, and then this hardmask is used as an etch mask to transfer the pattern onto the film that is to be actually fabricated by dry etching. This method allows the gas for etching the hardmask to be exchanged with the gas for etching the film that is to be actually fabricated. Since the gas can be selected such that selectivity of the resist increases when the hardmask is etched while selectivity of the hardmask increases when the film to be actually fabricated is etched, it is advantageous in that a pattern can be formed with a thin resist. Furthermore, as a contact plug for connecting with the substrate, a contact plug made of tungsten (hereinafter, referred to as a "tungsten plug") is used.

In a case where the dry etch residues are removed with an oxygen plasma, a Low-k film is exposed to an oxygen plasma and the like and damaged, causing a problem of significant deterioration of the electrical characteristics. Therefore, in order to manufacture a semiconductor element that uses a Low-k film, there is a need for a method of removing dry etch residues to an extent comparable to the oxygen plasma process, while suppressing damage on a Low-k film, cobalt, a barrier metal and a barrier insulating film. In some cases, there is also a need for suppressing the damage on tungsten so that it can further be used on a layer where a contact plug is exposed. Moreover, in a case where a hardmask is used, damage on the hardmask should also be suppressed.

Patent Document 1 proposes a wiring formation method that uses a cleaning liquid containing an inorganic base, a quaternary ammonium hydroxide, an organic solvent, a corrosion preventing agent and water. This cleaning liquid, however, is incapable of sufficiently removing the dry etch residues (see Comparative Example 5 described later).

Patent Document 2 proposes a wiring formation method that uses a cleaning liquid containing KOH, a quaternary ammonium hydroxide, an organic solvent, pyrazole and water. This cleaning liquid, however, is incapable of sufficiently removing the dry etch residues (see Comparative Example 6 described later).

Patent Document 3 proposes a method for preventing cobalt corrosion by using benzotriazole and the like. This method, however, is incapable of sufficiently removing the dry etch residues (see Comparative Example 7 described later).

Patent Document 4 proposes a method for preventing cobalt corrosion by employing a combination of 5-amino-1H-tetrazole and 1-hydroxybenzotriazole. This method, however, is incapable of sufficiently removing the dry etch residues (see Comparative Example 8 described later).

Patent Document 5 proposes a wiring formation method that uses a cleaning liquid containing an oxidant agent, a quaternary ammonium hydroxide, alkanolamine, an alkali metal hydroxide and water. Although this cleaning liquid is capable of removing the dry etch residues, it is incapable of suppressing the damages on the tungsten, the cobalt, the Low-k film and the hardmask, and thus cannot be used for the intended purpose (see Comparative Example 9 described later).

Patent Document 6 proposes a wiring formation method that uses a cleaning liquid containing an oxidant agent, amine, a quaternary ammonium hydroxide, an alkali metal hydroxide, an organic solvent and water. This cleaning liquid, however, is incapable of sufficiently suppressing the damages on the tungsten and the hardmask, and thus cannot be used for the intended purpose (see Comparative Example 10 described later).

Patent Document 7 proposes a method for preventing cobalt corrosion by employing copper (II), benzotriazole and the like to form a corrosion preventing film on cobalt. Although this method is capable of removing the dry etch residues, it is incapable of sufficiently suppressing the damage on cobalt (see Comparative Example 11 described later).

Patent Document 8 proposes a wiring formation method that uses a cleaning liquid containing a fluorine compound, a metal corrosion preventing agent, a passivation agent and water. This cleaning liquid, however, is incapable of sufficiently removing the dry etch residues, and thus cannot be used for the intended purpose (see Comparative Example 12 described later).

PRIOR ART DOCUMENTS

Patent Documents

Patent Document 1: Japanese Unexamined Patent Application Publication No. 2011-118101
Patent Document 2: International Patent Publication No. 2013-187313
Patent Document 3: Japanese Unexamined Patent Application Publication No. 2011-91248
Patent Document 4: Japanese Unexamined Patent Application Publication No. 2012-182158
Patent Document 5: Japanese Unexamined Patent Application Publication No. 2009-75285
Patent Document 6: Japanese Unexamined Patent Application Publication No. 2009-231354
Patent Document 7: Japanese Unexamined Patent Application Publication No. Heisei 6-81177
Patent Document 8: Japanese Unexamined Patent Application Publication No. 2013-533631

SUMMARY OF THE INVENTION

Problems to be Solved by the Invention

The objective of the present invention is to provide a cleaning liquid and a cleaning method for removing dry etch residues from a surface of a treated object while suppressing damage on a Low-k film, cobalt or a cobalt alloy, a tungsten plug, a hardmask, a barrier metal and a barrier insulating film during a process of manufacturing a semiconductor circuit.

Means for Solving the Problems

The present inventors have gone through keen studies to solve the above-described problem, as a result of which found that the above-described problems can be solved by the present invention below.
Thus, the present invention is as follows.
<1> A method for cleaning a semiconductor element which is obtained by forming a hardmask pattern on a substrate that has a low-dielectric-constant film and at least one of cobalt, a cobalt alloy and a tungsten plug, and then subjecting a hardmask, the low-dielectric-constant film and a barrier insulating film to a dry etching treatment using said hardmask pattern as a mask, the method comprising the step of removing dry etch residues with a cleaning liquid containing 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide and water.
<2> The cleaning method according to <1> above, wherein the alkali metal compound is at least one or more selected from the group consisting of sodium hydroxide, sodium sulfate, sodium carbonate, sodium hydrogen carbonate, sodium nitrate, sodium fluoride, sodium chloride, sodium bromide, sodium iodide, potassium hydroxide, potassium sulfate, potassium carbonate, potassium hydrogen carbonate, potassium nitrate, potassium fluoride, potassium chloride, potassium bromide, potassium iodide, cesium hydroxide, cesium sulfate, cesium carbonate, cesium hydrogen carbonate, cesium nitrate, cesium fluoride, cesium chloride, cesium bromide and cesium iodide.
<3> The cleaning method according to either one of <1> and <2> above, wherein the quaternary ammonium hydroxide is at least one or more selected from the group consisting of tetramethylammonium hydroxide, tetraethylammonium hydroxide, tetrapropylammonium hydroxide and tetrabutylammonium hydroxide.
<4> The cleaning method according to any one of <1> to <3> above, wherein the organic water-soluble solvent is at least one or more selected from the group consisting of ethanol, 1-propanol, 2-propanol, ethylene glycol, propylene glycol, glycerin, diethylene glycol, dipropylene glycol, sorbitol, xylitol, erythritol, pentaerythritol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol, tetraethylene glycol, polyethylene glycol, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, ethylene glycol monoacetate, ethylene glycol monomethyl ether acetate, ethylene glycol monoethyl ether acetate, diethylene glycol monoacetate, formamide, N,N-dimethylformamide, N,N-diethylformamide, acetamide, N,N-dimethylacetamide, N,N-diethylacetamide, N-methylpyrrolidone, N-ethylpyrrolidone, dimethyl sulfone, dimethyl sulfoxide, 1,3-dimethyl-2-imidazolidinone and sulfolane.
<5> A substrate manufactured by the cleaning method according to any one of <1> to <4> above.
<6> A cleaning liquid for removing dry etch residues by cleaning a semiconductor element which is obtained by forming a hardmask pattern on a substrate that has a low-dielectric-constant film and at least one of cobalt, a cobalt alloy and a tungsten plug, and then subjecting a hardmask, the low-dielectric-constant film and a barrier insulating film to a dry etching treatment using said hardmask pattern as a mask, the cleaning liquid containing 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide and water.
<7> The cleaning liquid according to <6> above, wherein the cleaning liquid does not contain alkanolamine.
<8> The cleaning liquid according to either one of <6> and <7> above, wherein the cleaning liquid only contains 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide and water.
<9> The cleaning liquid according to any one of <6> to <8> above, wherein the content of hydrogen peroxide in the cleaning liquid is 0.0001% by mass or more but less than 0.01% by mass.
<10> The cleaning liquid according to any one of <6> to <9> above, wherein the alkali metal compound is at least one or more selected from the group consisting of sodium hydroxide, sodium sulfate, sodium carbonate, sodium hydrogen carbonate, sodium nitrate, sodium fluoride, sodium chloride, sodium bromide, sodium iodide, potassium hydroxide, potassium sulfate, potassium carbonate, potassium hydrogen carbonate, potassium nitrate, potassium fluoride, potassium chloride, potassium bromide, potassium iodide, cesium hydroxide, cesium sulfate, cesium carbonate, cesium hydrogen carbonate, cesium nitrate, cesium fluoride, cesium chloride, cesium bromide and cesium iodide.

<11> The cleaning liquid according to any one of <6> to <10> above, wherein the quaternary ammonium hydroxide is at least one or more selected from the group consisting of tetramethylammonium hydroxide, tetraethylammonium hydroxide, tetrapropylammonium hydroxide and tetrabutylammonium hydroxide.

<12> The cleaning liquid according to any one of <6> to <11> above, wherein the organic water-soluble solvent is at least one or more selected from the group consisting of ethanol, 1-propanol, 2-propanol, ethylene glycol, propylene glycol, glycerin, diethylene glycol, dipropylene glycol, sorbitol, xylitol, erythritol, pentaerythritol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol, tetraethylene glycol, polyethylene glycol, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, ethylene glycol monoacetate, ethylene glycol monomethyl ether acetate, ethylene glycol monoethyl ether acetate, diethylene glycol monoacetate, formamide, N,N-dimethylformamide, N,N-diethylformamide, acetamide, N,N-dimethylacetamide, N,N-diethylacetamide, N-methylpyrrolidone, N-ethylpyrrolidone, dimethyl sulfone, dimethyl sulfoxide, 1,3-dimethyl-2-imidazolidinone and sulfolane.

Effect of the Invention

A cleaning liquid and a cleaning method of the present invention can be used to selectively remove dry etch residues from a surface of a treated object while suppressing damage on a Low-k film, cobalt or a cobalt alloy, a tungsten plug, a hardmask, a barrier metal and a barrier insulating film during a process of manufacturing a semiconductor circuit, thereby manufacturing a high-precision and high-quality semiconductor element with good yield.

BRIEF DESCRIPTION OF DRAWINGS

FIG. 1 A schematic cross-sectional view of a structure comprising a cobalt cap metal and a hardmask of a semiconductor element in a state prior to the removal of dry etch residues.

FIG. 2 A schematic cross-sectional view of a tungsten plug structure of a semiconductor element in a state prior to the removal of dry etch residues.

MODES FOR CARRYING OUT THE INVENTION

A liquid for cleaning dry etch residues according to the present invention is used during a process for manufacturing a semiconductor element, and suppresses damages on cobalt or a cobalt alloy, a tungsten plug, a hardmask, a barrier metal, a barrier insulating film and a Low-k film.

Examples of the alkali metal compound used with the present invention include sodium hydroxide, sodium sulfate, sodium carbonate, sodium hydrogen carbonate, sodium nitrate, sodium fluoride, sodium chloride, sodium bromide, sodium iodide, potassium hydroxide, potassium sulfate, potassium carbonate, potassium hydrogen carbonate, potassium nitrate, potassium fluoride, potassium chloride, potassium bromide, potassium iodide, cesium hydroxide, cesium sulfate, cesium carbonate, cesium hydrogen carbonate, cesium nitrate, cesium fluoride, cesium chloride, cesium bromide and cesium iodide. These alkali metal compounds may be used alone or two or more types of them may be blended in combination.

The concentration range of the alkali metal compound used with the present invention is 0.001-20% by mass, preferably 0.005-15% by mass and particularly preferably 0.01-12% by mass. Within the above-mentioned range, the dry etch residues can effectively be removed. On the other hand, if the concentration is greater than 20% by mass, there is a concern that the Low-k film may be damaged.

Specific examples of the quaternary ammonium hydroxide used with the present invention include tetramethylammonium hydroxide, tetraethylammonium hydroxide, tetrapropylammonium hydroxide and tetrabutylammonium hydroxide. These quaternary ammonium hydroxides may be used alone or two or more types of them may be blended in combination.

The concentration range of the quaternary ammonium hydroxide used with the present invention is 0.1-30% by mass, preferably 0.1-28% by mass, more preferably 1-25% by mass and particularly preferably 2-23% by mass. Within the above-mentioned range, the dry etch residues can effectively be removed.

Specific examples of the organic water-soluble solvent used with the present invention include ethanol, 1-propanol, 2-propanol, ethylene glycol, propylene glycol, glycerin, diethylene glycol, dipropylene glycol, sorbitol, xylitol, erythritol, pentaerythritol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol, tetraethylene glycol, polyethylene glycol, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, ethylene glycol monoacetate, ethylene glycol monomethyl ether acetate, ethylene glycol monoethyl ether acetate, diethylene glycol monoacetate, formamide, N,N-dimethylformamide, N,N-diethylformamide, acetamide, N,N-dimethylacetamide, N,N-diethylacetamide, N-methylpyrrolidone, N-ethylpyrrolidone, dimethyl sulfone, dimethyl sulfoxide, 1,3-dimethyl-2-imidazolidinone and sulfolane. These organic water-soluble solvents may be used alone or two or more types of them may be blended in combination.

The concentration range of the organic water-soluble solvent used with the present invention is 0.01-60% by mass, preferably 0.1-50% by mass and particularly preferably 5-40% by mass. Within the above-mentioned range, the dry etch residues can effectively be removed. On the other hand, if the concentration is less than 0.01% by mass, there is a concern that cobalt may be damaged or a foreign matter may be generated on cobalt after the chemical treatment.

The concentration range of hydrogen peroxide used with the present invention is 0.0001-0.1% by mass, preferably 0.001-0.05% by mass, more preferably 0.002-0.01% by mass, still more preferably the upper limit is less than 0.01% by mass and particularly preferably the upper limit is 0.009% or less by mass. If the concentration is less than 0.0001% by mass, cobalt may be damaged. On the other hand, if the concentration is greater than 0.1% by mass, tungsten and the hardmask may be damaged.

From an economic viewpoint, a preferable aspect of the cleaning liquid of the present invention does not contain alkanolamine.

Moreover, a preferable aspect of the cleaning liquid of the present invention contains only 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide and water.

If desired, an additive that is conventionally used in a semiconductor cleaning liquid may be blended with the cleaning liquid of the present invention within a range that does not impair the objective of the present invention. For example, a metal corrosion preventing agent having a pyridine skeleton, a pyrazole skeleton, a pyrimidine skeleton, an imidazole skeleton, a triazole skeleton or the like, a chelating agent, a surfactant, an antifoam agent or the like may be added.

The temperature at which the cleaning liquid of the present invention is used is in a range of 10-80° C. and preferably 20-70° C., which may suitably be selected according to etching conditions and a semiconductor substrate used.

If necessary, the cleaning method of the present invention may be used in conjunction with an ultrasound treatment.

The time of use of the cleaning liquid of the present invention is in a range of 0.5-60 minutes and preferably 1-10 minutes, which may suitably be selected according to etching conditions and a semiconductor substrate used.

As a rinsing liquid that is used after using the cleaning liquid of the present invention, an organic solvent such as alcohol may be used but simply rinsing with water is sufficient.

A semiconductor element or a display element to which the present invention can be applied comprises a substrate material such as silicon, amorphous silicon, polysilicon or glass, an insulating material such as silicon oxide, silicon nitride, silicon carbide or a derivative thereof, a material such as cobalt, a cobalt alloy, tungsten or titanium-tungsten, a compound semiconductor such as gallium-arsenide, gallium-phosphide, indium-phosphide, indium-gallium-arsenide or indium-aluminum-arsenide, an oxide semiconductor such as chromium oxide, and the like.

As a general Low-k film, hydroxy silsesquioxane (HSQ)-based or methyl silsesquioxane (MSQ)-based OCD (trade name, manufactured by Tokyo Ohka Kogyo Co., Ltd.), carbon-doped silicon oxide (SiOC)-based Black Diamond (trade name, manufactured by Applied Materials), Aurora (trade name, manufactured by ASM International), Coral (trade name, manufactured by Novellus Systems) or inorganic Orion (trade name, manufactured by Trikon Technologies) may be used. The Low-k film, however, is not limited thereto.

As a general barrier metal, tantalum, tantalum nitride, titanium, titanium nitride, ruthenium, manganese, magnesium or an oxide thereof may be used. The barrier metal, however, is not limited thereto.

As a general barrier insulating film, silicon nitride, silicon carbide, silicon carbonitride or the like may be used. The barrier insulating film, however, is not limited thereto.

As a general hardmask, an oxide, a nitride or a carbide of silicon, titanium, aluminum or tantalum may be used. Two or more types of these materials may be used as a laminate. The hardmask, however, is not limited thereto.

EXAMPLES

Hereinafter, the present invention will be described more specifically by way of Examples and Comparative Examples. The present invention, however, should not be limited in any way to these examples.

Scanning Electron Microscopic (SEM) Observation:

Ultra-high resolution field emission scanning electron microscope SU9000 manufactured by Hitachi High-Technologies Corporation was used for observation at a magnification of 100000× and a voltage of 2V.

Evaluations;

I. Removal State of Dry Etch Residues
  E: Removal of dry etch residues was complete.
  P: Removal of dry etch residues was insufficient.
  Evaluation of E was considered acceptable.

II. Damage on Tungsten
  E: No change was observed in tungsten in comparison with that before cleaning.
  G: Slight roughness was observed on the surface of tungsten.
  P: Large hole was observed in tungsten.
  Evaluations of E and G were considered acceptable.

III. Damage on Cobalt
  E: No change was observed in cobalt in comparison with that before cleaning.
  G: Slight change was observed in cobalt in comparison with that before cleaning.
  P: Change was observed in cobalt in comparison with that before cleaning.
  Evaluations of E and G were considered acceptable.

IV. Damage on Low-k Film
  E: No change was observed in Low-k film in comparison with that before cleaning.
  G: Low-k film was slightly recessed.
  P: Low-k film was largely recessed.
  Evaluations of E and G were considered acceptable.

V. Damage on Hardmask
  E: No change was observed in hardmask in comparison with that before cleaning.
  P: Peeling or change in shape was observed in hardmask.
  Evaluation of E was considered acceptable.

Examples 1-34

For the tests, semiconductor elements having wiring structures with cross-sections shown in FIGS. 1 and 2 were used to examine the cleaning effect. In order to remove dry etch residues 1, the semiconductor elements were immersed in a cleaning liquid indicated in Table 1 at a temperature and time indicated in Table 2, then rinsed with ultrapure water and dried by blowing dry nitrogen gas. The cleaned semiconductor elements were observed with SEM to evaluate the removal state of the dry etch residues 1 (FIGS. 1 and 2) as well as damages on the tungsten 3 (FIG. 2), the cobalt 4 (FIG. 1), the Low-k films 2 (FIGS. 1 and 2) and the hardmask 6 (FIG. 1). The semiconductor element shown in FIG. 1 is configured such that the wiring material 8 such as copper is covered and surrounded by the barrier metal 7 and capped with the cobalt 4.

In Examples 1-34 in which the cleaning liquids of the present invention indicated in Table 2 were applied, the dry etch residues 1 were found to be completely removed while preventing damages on the tungsten 3, the cobalt 4, the Low-k film 2 and the hardmask 6. Moreover, in all of the examples, no damage was observed on the barrier metal 7 and the barrier insulating film 5.

Comparative Example 1

An aqueous solution containing 16.5% by mass of tetramethylammonium hydroxide, 30% by mass of glycerin, 0.009% by mass of hydrogen peroxide and 53.491% by mass of water (Table 3, Cleaning liquid 2A) was used to clean the semiconductor elements shown in FIGS. 1 and 2. The cleaning conditions and the evaluation results are shown in Table 4. Although the dry etch residues 1 (FIGS. 1 and 2) were not removed, damages on the Low-k films 2 (FIGS. 1 and 2), the hardmask 6 (FIG. 1), the cobalt 4 (FIG. 1) and the tungsten 3 (FIG. 2) were prevented. Hence, it can be appreciated that Cleaning liquid 2A of Comparative Example 1 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 2

An aqueous solution containing 1.5% by mass of potassium hydroxide, 30% by mass of glycerin, 0.009% by mass of hydrogen peroxide and 68.491% by mass of water (Table 3, Cleaning liquid 2B) was used to clean the semiconductor elements shown in FIGS. 1 and 2. The cleaning conditions and the evaluation results are shown in Table 4. Although the dry etch residues 1 (FIGS. 1 and 2) were not removed, damages on the Low-k films 2 (FIGS. 1 and 2), the hardmask 6 (FIG. 1), the cobalt 4 (FIG. 1) and the tungsten 3 (FIG. 2) were prevented. Hence, it can be appreciated that Cleaning liquid 2B of Comparative Example 2 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 3

An aqueous solution containing 1.5% by mass of potassium hydroxide, 16.5% by mass of tetramethylammonium hydroxide, 0.009% by mass of hydrogen peroxide and 81.991% by mass of water (Table 3, Cleaning liquid 2C) was used to clean the semiconductor elements shown in FIGS. 1 and 2. The cleaning conditions and the evaluation results are shown in Table 4. The dry etch residues 1 (FIGS. 1 and 2) were removed. Although damages on the Low-k films 2 (FIGS. 1 and 2), the hardmask 6 (FIG. 1) and the tungsten 3 (FIG. 2) were prevented, generation of a foreign matter was observed on the cobalt 4 after the chemical treatment. Hence, it can be appreciated that Cleaning liquid 2C of Comparative Example 3 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 4

An aqueous solution containing 1.5% by mass of potassium hydroxide, 16.5% by mass of tetramethylammonium hydroxide, 30% by mass of glycerin and 52% by mass of water (Table 3, Cleaning liquid 2D) was used to clean the semiconductor elements shown in FIGS. 1 and 2. The cleaning conditions and the evaluation results are shown in Table 4. The dry etch residues 1 (FIGS. 1 and 2) were not removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2D of Comparative Example 4 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 5

An aqueous solution containing 10% by mass of tetramethylammonium hydroxide, 0.02% by mass of potassium hydroxide, 2% by mass of 2-phenyl-4-methyl imidazole, 20% by mass of diethylene glycol monoethyl ether and 67.98% by mass of water (Table 3, Cleaning liquid 2E) (corresponding to Patent Document 1 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were not removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2E of Comparative Example 5 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 6

An aqueous solution containing 0.2% by mass of potassium hydroxide, 15% by mass of tetramethylammonium hydroxide, 30% by mass of glycerin, 0.1% by mass of pyrazole and 54.7% by mass of water (Table 3, Cleaning liquid 2F) (corresponding to Patent Document 2 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were not removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2F of Comparative Example 6 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 7

An aqueous solution containing 1.5% by mass of potassium hydroxide, 16.5% by mass of tetramethylammonium hydroxide, 30% by mass of glycerin, 0.1% by mass of benzotriazole and 51.9% by mass of water (Table 3, Cleaning liquid 2G) (corresponding to Patent Document 3 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were not removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2G of Comparative Example 7 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 8

An aqueous solution containing 1.5% by mass of potassium hydroxide, 16.5% by mass of tetramethylammonium hydroxide, 30% by mass of glycerin, 0.1% by mass of 5-amino-1H-tetrazole, 0.1% by mass of 1-hydroxybenzotriazole and 51.8% by mass of water (Table 3, Cleaning liquid 2H) (corresponding to Patent Document 4 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were not removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2H of Comparative Example 8 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 9

An aqueous solution containing 12% by mass of tetramethylammonium hydroxide, 5% by mass of hydrogen peroxide, 2% by mass of potassium hydroxide, 35% by mass of triethanolamine and 46% by mass of water (Table 3, Cleaning liquid 2I) corresponding to Patent Document 5 listed under "PRIOR ART DOCUMENTS") was used to clean the semiconductor elements shown in FIGS. 1 and 2. The cleaning conditions and the evaluation results are shown in Table 4. Although the dry etch residues 1 (FIGS. 1 and 2) were removed, damages on the Low-k films 2 (FIGS. 1 and 2), the hardmask 6 (FIG. 1), the tungsten 3 (FIG. 2) and the cobalt 4 (FIG. 1) were observed. Hence, it can be appreciated that Cleaning liquid 2I of Comparative Example 9 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 10

An aqueous solution containing 2.6% by mass of potassium hydroxide, 0.9% by mass of hydrogen peroxide, 2% by mass of orthoperiodic acid, 0.03% by mass of ethylene diamine, 0.01% by mass of diethylenetriamine, 0.02% by mass of Surfynol 465, 0.02% by mass of cetyltrimethylammonium chloride, 10% by mass of N-methylpyrrolidone and 84.42% by mass of water (Table 3, Cleaning liquid 2J) (corresponding to Patent Document 6 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were removed. Although damages on the Low-k films 2 (FIGS. 1 and 2) and the cobalt 4 (FIG. 1) were prevented, damages on the tungsten 3 (FIG. 2) and the hardmask 6 (FIG. 1) were observed. Hence, it can be appreciated that Cleaning liquid 2J of Comparative Example 10 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 11

An aqueous solution containing 1.5% by mass of potassium hydroxide, 16.5% by mass of tetramethylammonium hydroxide, 30% by mass of glycerin, 0.12% by mass of benzotriazole, 0.0008% by mass of copper sulfate and 51.879% by mass of water (Table 3, Cleaning liquid 2K) (corresponding to Patent Document 7 listed under "PRIOR ART DOCUMENTS") was used to clean the semiconductor elements shown in FIGS. 1 and 2. The cleaning conditions and the evaluation results are shown in Table 4. The dry etch residues 1 (FIGS. 1 and 2) were removed. Although damages on the Low-k films 2 (FIGS. 1 and 2), the hardmask 6 (FIG. 1) and the tungsten 3 (FIG. 2) were prevented, a damage on the cobalt 4 (FIG. 1) was observed. Hence, it can be appreciated that Cleaning liquid 2K of Comparative Example 11 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

Comparative Example 12

An aqueous solution containing 0.1% by mass of benzotriazole, 0.1% by mass of 1,2,4-triazole, 5% by mass of ammonium fluoride, 1% by mass of boric acid and 84.42% by mass of water (Table 3, Cleaning liquid 2L) (corresponding to Patent Document 8 listed under "PRIOR ART DOCUMENTS") was used to clean the semiconductor elements shown in FIGS. 1 and 2. The cleaning conditions and the evaluation results are shown in Table 4. Although damages on the Low-k films 2 (FIGS. 1 and 2), the hardmask 6 (FIG. 1), the tungsten 3 (FIG. 2) and the cobalt 4 (FIG. 1) were prevented, the dry etch residues 1 (FIGS. 1 and 2) were not removed. Hence, it can be appreciated that Cleaning liquid 2L of Comparative Example 12 cannot be used for the objective of removing the dry etch residues from the surface of the treated object while suppressing damages on the Low-k film, the cobalt or the cobalt alloy, the tungsten, the barrier metal, the barrier insulating film and the hardmask during a process of manufacturing a semiconductor integrated circuit targeted by the present invention (Table 4).

TABLE 1

| Cleaning liquid | Alkali metal salt Type | Alkali metal salt Concentration % by mass | Quaternary ammonium hydroxide Type | Quaternary ammonium hydroxide Concentration % by mass | Organic water-soluble solvent Type | Organic water-soluble solvent Concentration % by mass | Hydrogen peroxide Concentration % by mass | Water Concentration % by mass |
|---|---|---|---|---|---|---|---|---|
| 1A | KOH | 1.5 | TMAH | 16.5 | Glycerin | 30 | 0.009 | 51.991 |
| 1B | KOH | 4.5 | TMAH | 10 | Glycerin | 5 | 0.009 | 80.491 |
| 1C | KOH | 10 | TMAH | 5 | Glycerin | 15 | 0.006 | 69.994 |
| 1D | KOH | 0.01 | TMAH | 15 | Glycerin | 15 | 0.009 | 69.981 |
| 1E | KOH | 2 | TMAH | 22.5 | Glycerin | 5 | 0.009 | 70.491 |
| 1F | KOH | 10 | TMAH | 1 | Glycerin | 15 | 0.009 | 73.991 |
| 1G | KOH | 0.5 | TMAH | 15 | Glycerin | 18 | 0.04 | 66.46 |
| 1H | KOH | 4.5 | TMAH | 10 | Glycerin | 15 | 0.001 | 70.499 |
| 1I | KOH | 6 | TMAH | 8 | Glycerin | 45 | 0.009 | 40.991 |
| 1J | KOH | 4.5 | TMAH | 10 | Glycerin | 0.1 | 0.006 | 85.394 |
| 1K | KOH | 1 | TMAH | 15 | Glycerin | 15 | 0.009 | 68.991 |
| 1L | K$_2$SO$_4$ | 2 | TMAH | 16.5 | Glycerin | 30 | 0.009 | 51.491 |
| 1M | K$_2$CO$_3$ | 2 | TMAH | 16.5 | Glycerin | 30 | 0.009 | 51.491 |
| 1N | NaOH | 2 | TMAH | 16.5 | Glycerin | 30 | 0.009 | 51.491 |
| 1O | Cs$_2$CO$_3$ | 2 | TMAH | 16.5 | Glycerin | 30 | 0.009 | 51.491 |
| 1P | KOH | 10 | TEAH | 8 | Glycerin | 30 | 0.006 | 51.994 |
| 1Q | KOH | 10 | TPAH | 2.25 | Glycerin | 30 | 0.009 | 57.741 |
| 1R | KOH | 4.5 | TBAH | 18.17 | Glycerin | 30 | 0.006 | 47.324 |
| 1S | KOH | 4.5 | TMAH | 10 | Ethanol | 15 | 0.006 | 70.494 |
| 1T | KOH | 4.5 | TMAH | 10 | 2-Propanol | 15 | 0.006 | 70.494 |
| 1U | KOH | 4.5 | TMAH | 10 | Ethylene glycol | 15 | 0.006 | 70.494 |
| 1V | KOH | 4.5 | TMAH | 10 | Propylene glycol | 15 | 0.012 | 70.488 |
| 1W | KOH | 4.5 | TMAH | 10 | Diethylene glycol | 15 | 0.006 | 70.494 |
| 1X | KOH | 4.5 | TMAH | 10 | Sorbitol | 0.1 | 0.009 | 85.391 |
| 1Y | KOH | 4.5 | TMAH | 10 | Xylitol | 0.1 | 0.009 | 85.391 |
| 1Z | KOH | 4.5 | TMAH | 10 | Pentaerythritol | 15 | 0.006 | 70.494 |
| 1AA | KOH | 4.5 | TMAH | 10 | Erythritol | 0.1 | 0.009 | 85.391 |
| 1AB | KOH | 4.5 | TMAH | 10 | Polyethylene glycol (Number average molecular weight: 400) | 15 | 0.006 | 70.494 |
| 1AC | KOH | 4.5 | TMAH | 10 | Diethylene glycol monomethyl ether | 15 | 0.012 | 70.488 |
| 1AD | KOH | 4.5 | TMAH | 10 | Diethylene glycol monoethyl ether | 15 | 0.006 | 70.494 |
| 1AE | KOH | 4.5 | TMAH | 10 | Diethylene glycol monobutyl ether | 15 | 0.006 | 70.494 |
| 1AF | KOH | 4.5 | TMAH | 10 | Diethylene glycol dimethyl ether | 15 | 0.006 | 70.494 |
| 1AG | KOH | 4.5 | TMAH | 10 | N,N-dimethyl formamide | 15 | 0.006 | 70.494 |
| 1AH | KOH | 4.5 | TMAH | 10 | N,N-dimethyl acetamide | 15 | 0.006 | 70.494 |

KOH: Potassium hydroxide
K$_2$SO$_4$: Potassium sulfate
K$_2$CO$_3$: Potassium carbonate
NaOH: Sodium hydroxide
Cs$_2$CO$_3$: Cesium carbonate
TMAH: Tetramethylammonium hydroxide
TEAH: Tetraethylammonium hydroxide
TPAH: Tetrapropylammonium hydroxide
TBAH: Tetrabutylammonium hydroxide

TABLE 2

| Example | Cleaning liquid | Temperature °C | Immersion time min | Removal state I | Damage II | III | IV | V |
|---|---|---|---|---|---|---|---|---|
| 1 | 1A | 50 | 6 | E | E | E | E | E |
| 2 | 1B | 40 | 6 | E | E | E | E | E |
| 3 | 1C | 40 | 6 | E | E | E | G | E |
| 4 | 1D | 70 | 9 | E | E | E | E | E |
| 5 | 1E | 40 | 6 | E | E | E | E | E |
| 6 | 1F | 40 | 6 | E | E | E | G | E |
| 7 | 1G | 60 | 2 | E | G | E | E | E |
| 8 | 1H | 20 | 60 | E | G | E | E | E |
| 9 | 1I | 50 | 6 | E | E | E | G | E |
| 10 | 1J | 40 | 6 | E | E | E | G | E |
| 11 | 1K | 70 | 1 | E | E | E | E | E |
| 12 | 1L | 50 | 9 | E | G | E | G | E |
| 13 | 1M | 50 | 6 | E | E | E | G | E |
| 14 | 1N | 50 | 4 | E | E | E | G | E |
| 15 | 1O | 65 | 10 | E | G | E | G | E |
| 16 | 1P | 40 | 10 | E | E | E | G | E |
| 17 | 1Q | 40 | 6 | E | E | E | G | E |
| 18 | 1R | 40 | 6 | E | E | E | G | E |
| 19 | 1S | 40 | 6 | E | E | G | G | E |
| 20 | 1T | 40 | 6 | E | G | G | G | E |
| 21 | 1U | 40 | 6 | E | E | E | G | E |
| 22 | 1V | 40 | 6 | E | G | E | G | E |
| 23 | 1W | 40 | 6 | E | G | E | G | E |
| 24 | 1X | 40 | 6 | E | G | E | G | E |
| 25 | 1Y | 40 | 6 | E | G | E | G | E |
| 26 | 1Z | 40 | 6 | E | E | E | G | E |
| 27 | 1AA | 40 | 6 | E | G | E | G | E |
| 28 | 1AB | 40 | 6 | E | E | G | G | E |
| 29 | 1AC | 40 | 6 | E | E | G | G | E |
| 30 | 1AD | 40 | 6 | E | G | E | G | E |
| 31 | 1AE | 40 | 6 | E | E | E | G | E |
| 32 | 1AF | 40 | 6 | E | G | G | G | E |
| 33 | 1AG | 40 | 6 | E | G | E | G | E |
| 34 | 1AH | 40 | 6 | E | G | E | G | E |

Removal state I: Removal state of dry etch residues 1
Damage II: Damage on tungsten 3
Damage III: Damage on cobalt 4
Damage IV: Damage on Low-k film 2
Damage V: Damage on hardmask 6

TABLE 3

| Cleaning liquid | Composition of cleaning liquid (concentration is expressed in % by mass) |
|---|---|
| 2A | Tetramethylammonium hydroxide16.5%, glycerin 30%, hydrogen peroxide 0.009%, water 53.491% |
| 2B | Potassium hydroxide 1.5%, glycerin 30%, hydrogen peroxide 0.009%, water 68.491% |
| 2C | Potassium hydroxide 1.5%, tetramethylammonium hydroxide 16.5%, hydrogen peroxide 0.009%, water 81.991% |
| 2D | Potassium hydroxide 1.5%, tetramethylammonium hydroxide 16.5%, glycerin 30%, water 52% |
| 2E | Tetramethylammonium hydroxide 10%, potassium hydroxide 0.02%, 2-phenyl-4-methyl imidazole 2%, diethylene glycol monoethyl ether 20%, water 67.98% |
| 2F | Potassium hydroxide 0.2%, tetramethylammonium hydroxide 15%, glycerin 30%, pyrazole 0.1%, water 54.7% |
| 2G | Potassium hydroxide 1.5%, tetramethylammonium hydroxide 16.5%, glycerin 30%, benzotriazole 0.1%, water 51.9% |
| 2H | Potassium hydroxide 1.5%, tetramethylammonium hydroxide 16.5%, glycerin 30%, 5-amino-1H-tetrazole 0.1%, 1-hydroxybenzotriazole 0.1%, water 51.8% |
| 2I | Tetramethylammonium hydroxide 12%, hydrogen peroxide 5%, potassium hydroxide 2%, triethanolamine 35%, water 46% |
| 2J | Potassium hydroxide 2.6%, hydrogen peroxide 0.9%, orthoperiodic acid 2%, ethylene diamine 0.03%, diethylenetriamine 0.01%, Surfynol 465 0.02%, cetyltrimethylammonium chloride 0.02%, N-methylpyrrolidone 10%, water 84.42% |
| 2K | Potassium hydroxide 1.5%, tetramethylammonium hydroxide 16.5%, glycerin 30%, benzotriazole 0.12%, copper sulfate 0.0008%, water 51.879% |
| 2L | Benzotriazole 0.1%, 1,2,4-triazole 0.1%, ammonium fluoride 5%, boric acid 1%, water 84.42% |

TABLE 4

| Comparative Example | Cleaning liquid | Temperature °C | Immersion time min | Removal state I | Damage II | III | IV | V |
|---|---|---|---|---|---|---|---|---|
| 1 | 2A | 50 | 6 | P | E | E | E | E |
| 2 | 2B | 50 | 6 | P | G | E | E | E |
| 3 | 2C | 50 | 6 | E | G | P | G | E |
| 4 | 2D | 50 | 6 | P | E | P | G | E |
| 5 | 2E | 50 | 6 | P | E | P | E | E |
| 6 | 2F | 50 | 6 | P | E | P | E | E |
| 7 | 2G | 50 | 6 | P | E | P | G | E |
| 8 | 2H | 50 | 6 | P | E | P | G | E |
| 9 | 2I | 50 | 6 | E | P | P | P | P |
| 10 | 2J | 50 | 6 | E | P | E | P | E |
| 11 | 2K | 50 | 6 | E | E | P | G | E |
| 12 | 2L | 50 | 6 | P | E | E | E | E |

Removal state I: Removal state of dry etch residues 1
Damage II: Damage on tungsten 3
Damage III: Damage on cobalt 4
Damage IV: Damage on Low-k film 2
Damage V: Damage on hardmask 6

INDUSTRIAL APPLICABILITY

A cleaning liquid and a cleaning method of the present invention can be used to remove dry etch residues from a surface of a treated object while suppressing damage on a Low-k film, cobalt or a cobalt alloy, a tungsten plug, a hardmask, a barrier metal and a barrier insulating film during a process of manufacturing a semiconductor circuit, thereby manufacturing a high-precision and high-quality semiconductor element with good yield, which is industrially useful.

DESCRIPTION OF REFERENCE NUMERALS

1: Dry etch residues
2: Low-k film
3: Tungsten plug
4: Cobalt
5: Barrier insulating film
6: Hardmask
7: Barrier metal
8: Wiring material (copper)

The invention claimed is:
1. A method for cleaning a semiconductor element which is obtained by forming a hardmask pattern on a substrate that has a low-dielectric-constant film and at least one of cobalt, a cobalt alloy and a tungsten plug, and then subjecting a hardmask, the low-dielectric-constant film and a barrier insulating film to a dry etching treatment using said hardmask pattern as a mask, the method comprising:

removing dry etch residues with a cleaning liquid containing 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide, and water.

2. The method according to claim 1, wherein the alkali metal compound is one or more selected from the group consisting of sodium hydroxide, sodium sulfate, sodium carbonate, sodium hydrogen carbonate, sodium nitrate, sodium fluoride, sodium chloride, sodium bromide, sodium iodide, potassium hydroxide, potassium sulfate, potassium carbonate, potassium hydrogen carbonate, potassium nitrate, potassium fluoride, potassium chloride, potassium bromide, potassium iodide, cesium hydroxide, cesium sulfate, cesium carbonate, cesium hydrogen carbonate, cesium nitrate, cesium fluoride, cesium chloride, cesium bromide, and cesium iodide.

3. The method according to claim 1, wherein the quaternary ammonium hydroxide is one or more selected from the group consisting of tetramethylammonium hydroxide, tetraethylammonium hydroxide, tetrapropylammonium hydroxide, and tetrabutylammonium hydroxide.

4. The method according to claim 1, wherein the organic water-soluble solvent is one or more selected from the group consisting of ethanol, 1-propanol, 2-propanol, ethylene glycol, propylene glycol, glycerin, diethylene glycol, dipropylene glycol, sorbitol, xylitol, erythritol, pentaerythritol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol, tetraethylene glycol, polyethylene glycol, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, ethylene glycol monoacetate, ethylene glycol monomethyl ether acetate, ethylene glycol monoethyl ether acetate, diethylene glycol monoacetate, formamide, N,N-dimethylformamide, N,N-diethylformamide, acetamide, N,N-dimethylacetamide, N,N-diethylacetamide, N-methylpyrrolidone, N-ethylpyrrolidone, dimethyl sulfone, dimethyl sulfoxide, 1,3-dimethyl-2-imidazolidinone, and sulfolane.

5. A substrate manufactured by the method according to claim 1.

6. A cleaning liquid for removing dry etch residues by cleaning a semiconductor element which is obtained by forming a hardmask pattern on a substrate that has a low-dielectric-constant film and at least one of cobalt, a cobalt alloy and a tungsten plug, and then subjecting a hardmask, the low-dielectric-constant film and a barrier insulating film to a dry etching treatment using said hardmask pattern as a mask, the cleaning liquid containing 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide, and water.

7. The cleaning liquid according to claim 6, wherein the cleaning liquid does not contain alkanolamine.

8. The cleaning liquid according to claim 6, wherein the cleaning liquid only contains 0.001-20% by mass of an alkali metal compound, 0.1-30% by mass of a quaternary ammonium hydroxide, 0.01-60% by mass of an organic water-soluble solvent, 0.0001-0.1% by mass of hydrogen peroxide, and water.

9. The cleaning liquid according to claim 6, wherein the content of hydrogen peroxide in the cleaning liquid is from 0.0001% by mass to less than 0.01% by mass.

10. The cleaning liquid according to claim 6, wherein the alkali metal compound is one or more selected from the group consisting of sodium hydroxide, sodium sulfate, sodium carbonate, sodium hydrogen carbonate, sodium nitrate, sodium fluoride, sodium chloride, sodium bromide, sodium iodide, potassium hydroxide, potassium sulfate, potassium carbonate, potassium hydrogen carbonate, potassium nitrate, potassium fluoride, potassium chloride, potassium bromide, potassium iodide, cesium hydroxide, cesium sulfate, cesium carbonate, cesium hydrogen carbonate, cesium nitrate, cesium fluoride, cesium chloride, cesium bromide, and cesium iodide.

11. The cleaning liquid according to claim 6, wherein the quaternary ammonium hydroxide is one or more selected from the group consisting of tetramethylammonium hydroxide, tetraethylammonium hydroxide, tetrapropylammonium hydroxide, and tetrabutylammonium hydroxide.

12. The cleaning liquid according to claim 6, wherein the organic water-soluble solvent is one or more selected from the group consisting of ethanol, 1-propanol, 2-propanol, ethylene glycol, propylene glycol, glycerin, diethylene glycol, dipropylene glycol, sorbitol, xylitol, erythritol, pentaerythritol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol, tetraethylene glycol, polyethylene glycol, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, ethylene glycol monoacetate, ethylene glycol monomethyl ether acetate, ethylene glycol monoethyl ether acetate, diethylene glycol monoacetate, formamide, N,N-dimethylformamide, N,N-diethylformamide, acetamide, N,N-dimethylacetamide, N,N-diethylacetamide, N-methylpyrrolidone, N-ethylpyrrolidone, dimethyl sulfone, dimethyl sulfoxide, 1,3-dimethyl-2-imidazolidinone, and sulfolane.

* * * * *